United States Patent [19]
Wendelrup

[11] Patent Number: 5,796,360
[45] Date of Patent: Aug. 18, 1998

[54] FAST SIGMA-DELTA MODULATOR HAVING A CONTROLLED CLOCK GENERATOR

[75] Inventor: Heino Wendelrup, Malmö, Sweden

[73] Assignee: Telefonaktiebolate LM Ericsson, Stockholm, Sweden

[21] Appl. No.: 840,172

[22] Filed: Apr. 14, 1997

Related U.S. Application Data

[63] Continuation of Ser. No. 389,406, Feb. 16, 1995, abandoned.

[51] Int. Cl.$^6$ ............................................. H03M 3/00
[52] U.S. Cl. ............................................. 341/143
[58] Field of Search ............................ 341/143, 172; 307/269; 375/376

[56] References Cited

U.S. PATENT DOCUMENTS

| | | | |
|---|---|---|---|
| 4,947,171 | 8/1990 | Pfeifer et al. | 341/143 |
| 5,055,843 | 10/1991 | Ferguson et al. | 341/143 |
| 5,087,829 | 2/1992 | Ishibashi et al. | 307/269 |
| 5,140,325 | 8/1992 | Yu et al. | 341/143 |
| 5,146,121 | 9/1992 | Searles et al. | |
| 5,150,068 | 9/1992 | Kawashima et al. | |
| 5,184,027 | 2/1993 | Masuda et al. | 307/269 |
| 5,311,181 | 5/1994 | Ferguson, Jr. et al. | 341/143 |
| 5,313,205 | 5/1994 | Wilson. | |
| 5,349,352 | 9/1994 | Saleh. | |
| 5,398,263 | 3/1995 | Vanderspool, II et al. | 375/376 |
| 5,408,235 | 4/1995 | Doyle et al. | 341/143 |
| 5,436,939 | 7/1995 | Co et al. | 375/376 |

FOREIGN PATENT DOCUMENTS

| | | |
|---|---|---|
| 0 506 094 A2 | 9/1992 | European Pat. Off. |
| 0 609 967 A2 | 8/1994 | European Pat. Off. |

OTHER PUBLICATIONS

M. Rebeschini, "Practical Considerations in SC Circuit Design", *Practical Aspects in Analog and Mixes ICs*, pp. 37–38 and 52–61, Lausanne, Switzerland, Jul. 4–8, 1994.

Kenichi Sugitani et al., "Improvement of Performances of SC Sigma–Delta Modulators," *IEICE Transactions on Fundamentals of Electronics, Communications and Computer Sciences*, pp. 931–938, vol. E76–A, No. 6, Jun. 1993, Tokyo, JP.

*Primary Examiner*—Brian K. Young
*Attorney, Agent, or Firm*—Burns, Doane, Swecker & Mathis, L.L.P.

[57] ABSTRACT

An apparatus receives a reference clock signal that is then applied to a first one of a number of series-connected controllable delay stages. The output of each delay stage is a further delayed version of its input, the amount of delay being controlled by a control signal. A phase relation between a first preselected one of the plurality of delayed reference clock signals and a second preselected one of the plurality of delayed reference clock signals is measured. Alternatively, it may be a phase relation between the reference clock signal and a preselected one of the plurality of delayed reference clock signals that is measured. The measured phase relation is compared with a desired phase relation, and the difference is an error signal that is fed back to the delay stages for use as the delay control signal. In this manner, the delayed reference clock outputs from the delay stages lock in to a very stable desired phase relation with respect to one another. The delayed reference clocks are then transformed by logic circuitry into nonoverlapping phase clocks for use by a switched capacitor sigma-delta modulator. By using the clocks generated in this manner, the switched-capacitor sigma-delta modulator may be operated at rates of 13 MHz or higher.

8 Claims, 10 Drawing Sheets

FAST SIGMA-DELTA MODULATOR HAVING A CONTROLLED CLOCK GENERATOR

This application is a continuation of application Ser. No. 08/389,406, filed Feb. 16, 1995 now abandoned.

BACKGROUND

The present invention relates to controlled clock generators, and more particularly, to a controlled clock generator for a sigma-delta modulator that requires non-overlapping clocks.

Figure 1:
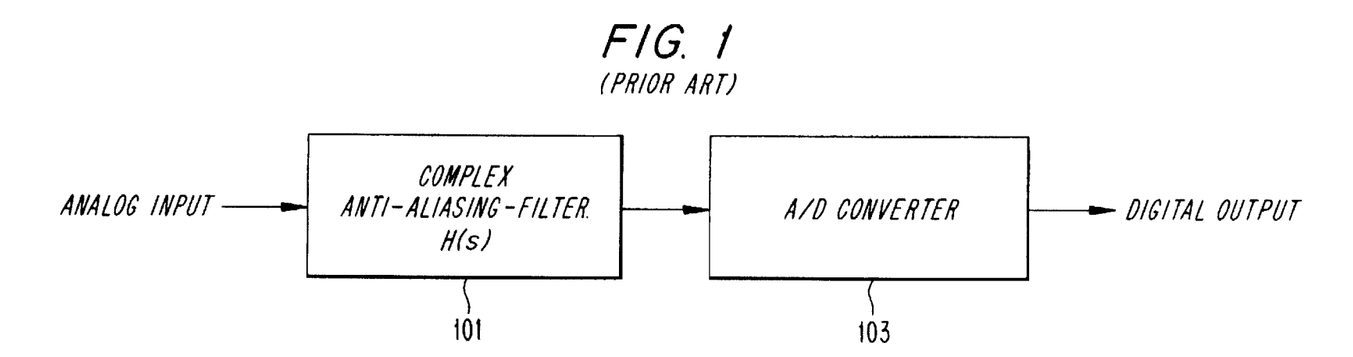
FIG. 1 is a diagram of a prior art configuration in which an A/D converter of the non-sigma-delta type is connected to a complex anti-aliasing filter.

It is known in the art to use analog-to-digital (A/D) converters in a wide variety of applications. Many of these applications impose the requirement that the A/D converter provide high-resolution and operate at high-speed. Among the various techniques that have been used for converting analog signals into digital form, a technique called sigma-delta conversion, involving a combination of oversampling and noise shaping, has become one of the most frequently relied on. This is because the over-sampling removes the need for an accurate and expensive anti-aliasing filter that would otherwise be required if other conversion techniques were employed. FIG. 1 illustrates a prior art configuration in which an A/D converter 103 of the non-sigma-delta type is connected to a complex anti-aliasing filter 101.

Figure 2:
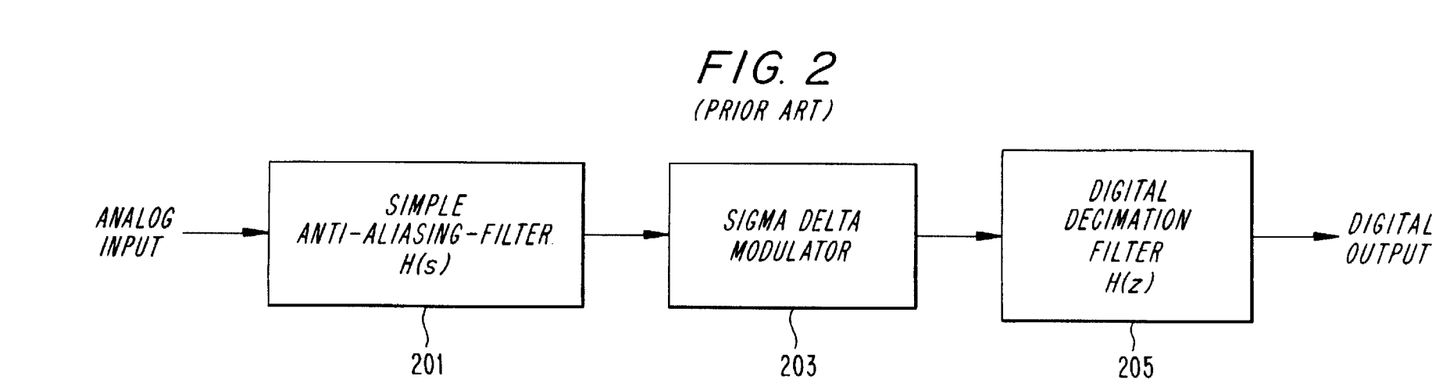
FIG. 2 is a diagram of a prior art configuration of an A/D converter of the sigma-delta type.

By contrast, FIG. 2 shows a prior art configuration of an A/D converter of the sigma-delta type. The complex anti-aliasing filter 101 has been replaced by a much simpler prefilter 201. Following the sigma-delta modulator 203 is a digital decimation filter 205. Both the prefilter 201 and the sigma-delta modulator 203 have much less demanding tolerances than those of the complex anti-aliasing filter 101. Further, the digital decimation filter 205 that follows the sigma-delta modulator 203 is accurate and is not affected by manufacturing process variations.

Sigma-delta modulators can also be integrated in mixed-signal VLSI integrated circuits. In such circuits, the noise-shaper in the sigma-delta modulator 203 is frequently implemented by means of switched-capacitor technology. The theory and use of high-resolution A/D convertors that employ switched-capacitor sigma-delta modulators is described in U.S. Pat. No. 5,311,181 to Ferguson, Jr. et al., which is herein incorporated by reference in its entirety.

Figure 3:
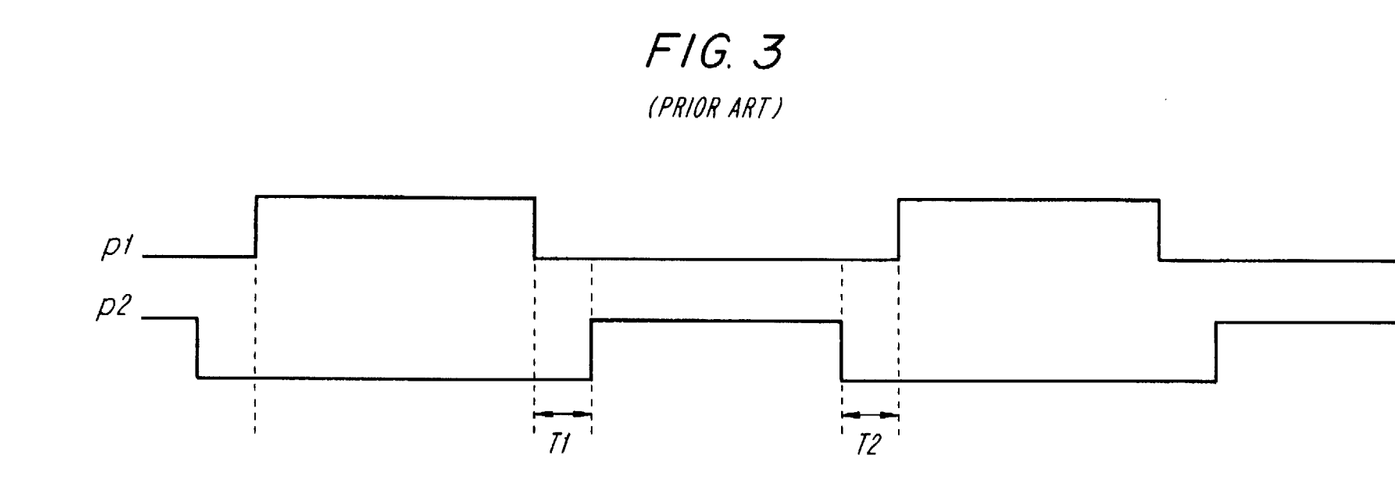
FIG. 3 is a timing diagram of the clock requirements for a conventional switched-capacitor sigma-delta modulator.

A switched-capacitor sigma-delta modulator requires a two-phase clock for proper operation. The clock requirements for a conventional switched-capacitor sigma-delta modulator are illustrated in FIG. 3. The two phases p1, p2 must be non-overlapping, as shown. That is, there must be an interval T1 of non-zero duration after the de-assertion of the first phase p1 and assertion of the second phase p2. Similarly, there must also be an interval T2 of non-zero duration after the de-assertion of the second phase p2 and the assertion of the first phase p1.

Figure 4:
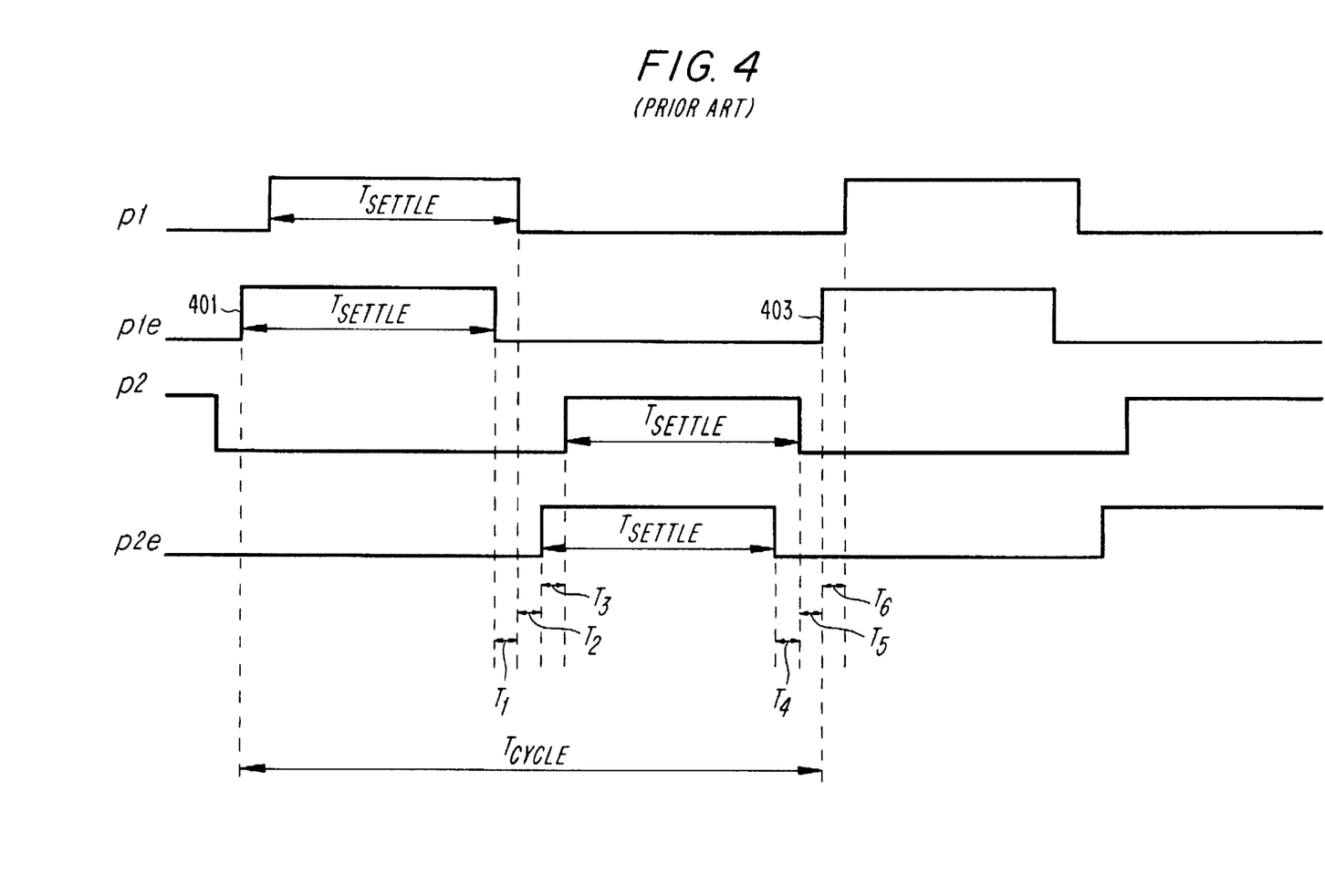
FIG. 4 is a timing diagram of the clock requirements, including two early phase clocks and first and second phase clocks, for a switched-capacitor filter having improved performance.

A known method of improving the noise performance of a switched-capacitor filter is to minimize switch induced error voltages on the switched capacitors by utilizing designs that require two early phase clocks p1e, p2e in addition to the standard first and second phase clocks p1, p2, as shown in FIG. 4. (In some prior art descriptions, the point of reference is the opposite to that which is described here, so that the four clocks are said to comprise standard first and second phase clocks and first and second delayed phase clocks. Whatever the nomenclature, however, the principles of operation are the same.) The switches in the filter need to be closed during the time required for the switched-capacitor filter's operational amplifiers to settle and also during the time required to change the charge stored in the capacitors. In FIG. 4, these times are determined by the positive assertions of the respective signals. A more detailed discussion of the use of early phase clock signals in a switched-capacitor filter may be found in M. Rebeschini, "Practical Considerations in SC Circuit Design", *Practical Aspects in Analog and Mixed ICs*, pp. 37–61, Lausanne, Switzerland, Jul. 4–8, 1994, which is incorporated herein by reference.

Although in many applications it is desired to operate the sigma-delta modulator at very high speeds, a limiting factor is the accuracy of the two-phase clock. For example, the assertion time duration, $T_{Settle}$, for each of the phase clocks p1, p1e, p2, p2e is typically at least 15 ns. The first phase clock p1 lags the first early phase clock p1e by an amount $T_1$ by at least 3 ns. Similarly, the second phase clock p2 lags the second early phase clock p2e by an amount $T_3$ that is also at least 3 ns. Furthermore, the nonoverlap times $T_2$ and $T_5$, during which none of the phase clocks p1, p1e, p2, p2e are asserted, should each be at least 3 ns long.

Thus, the minimum amount of time that is required for a complete cycle of four clocks, $T_{Cycle}$ (e.g., the time duration between a first assertion 401 of the first early phase clock p1e and a next assertion 403 of the first early phase clock p1e), is:

$$T_{Cycle}=2*T_{Settle}+T_1+T_2+T_3+T_5=2*15ns+4*3ns=42ns$$

Figure 5:
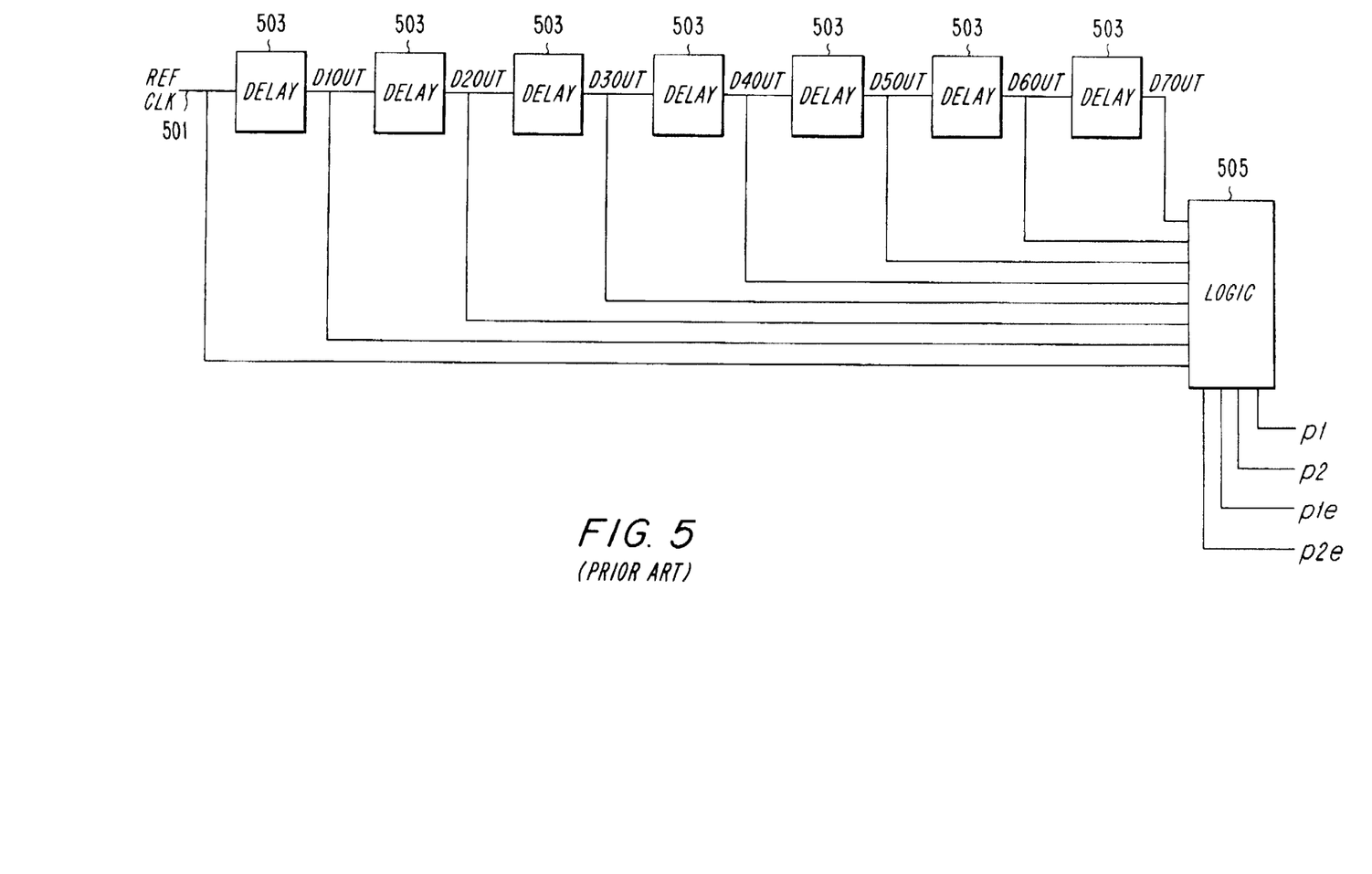
FIG. 5, is a block diagram of a series of delay stages for generating switched capacitor sigma-delta modulator clocks in accordance with prior art techniques.
Figure 6:
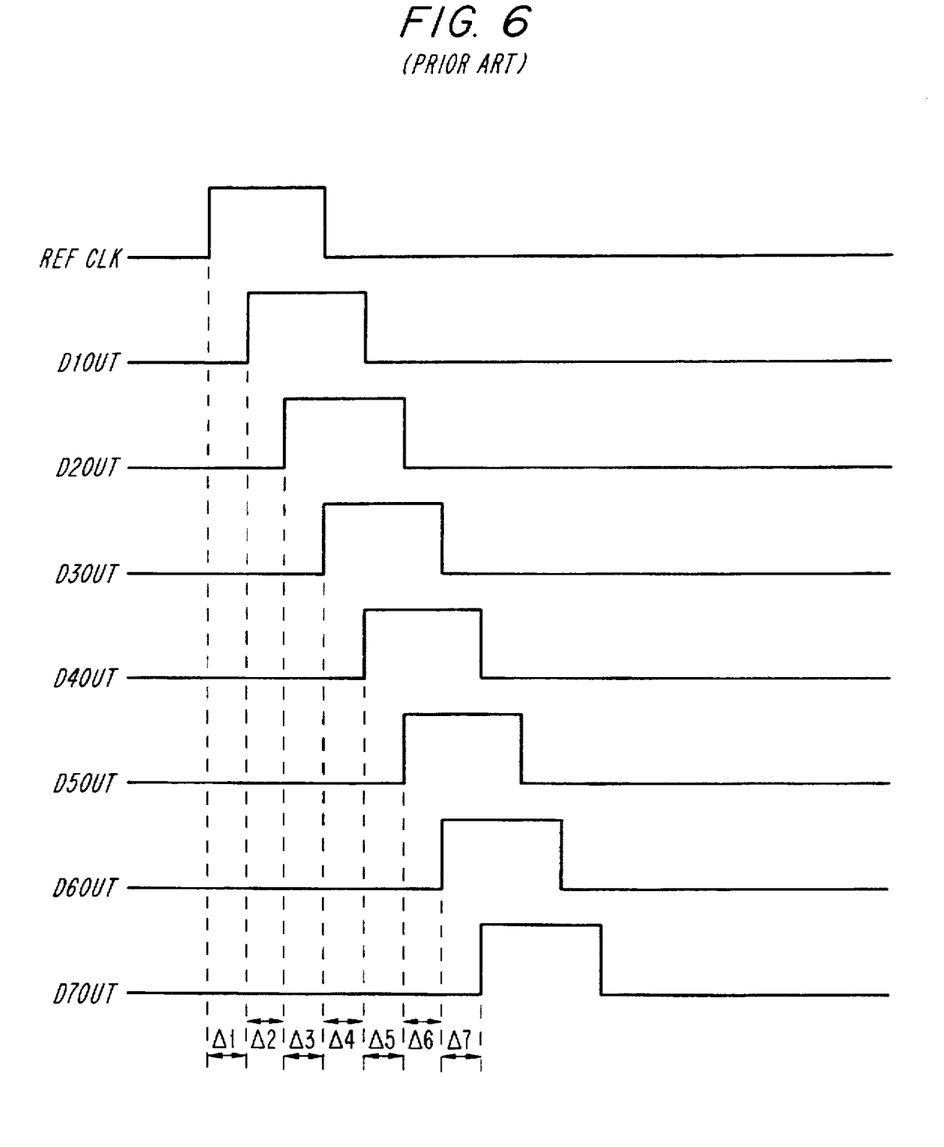
FIG. 6 is a timing diagram of the signals that are produced by series of delay stages of FIG. 5.

From the above equation, it can be seen that a theoretical upper limit for execution speed of a switched-capacitor sigma-delta modulator is 1/42 ns=23.8 MHz. However, any practical design of such a modulator must take into account the fact that conventional circuits for generating the various phase clocks p1, p1e, p2, p2e have tolerances that permit any of the times $T_1$, $T_2$, $T_3$, $T_4$, $T_5$ and $T_6$ to deviate from a desired length. This is because the various phase clocks p1, p1e, p2, p2e are conventionally derived from a reference clock 501 that is passed through a series of delay stages 503, as illustrated in FIG. 5. FIG. 6 shows the signals that are produced by this arrangement. Each of the delay stages 503 is designed to generate an output that is a reproduction of its input delayed by an amount Δ. The reference clock 501 and the seven delayed signals D1Out ... D7Out are supplied to logic circuitry that converts them into the four phase clocks p1, p1e, p2, p2e.

Figure 7:
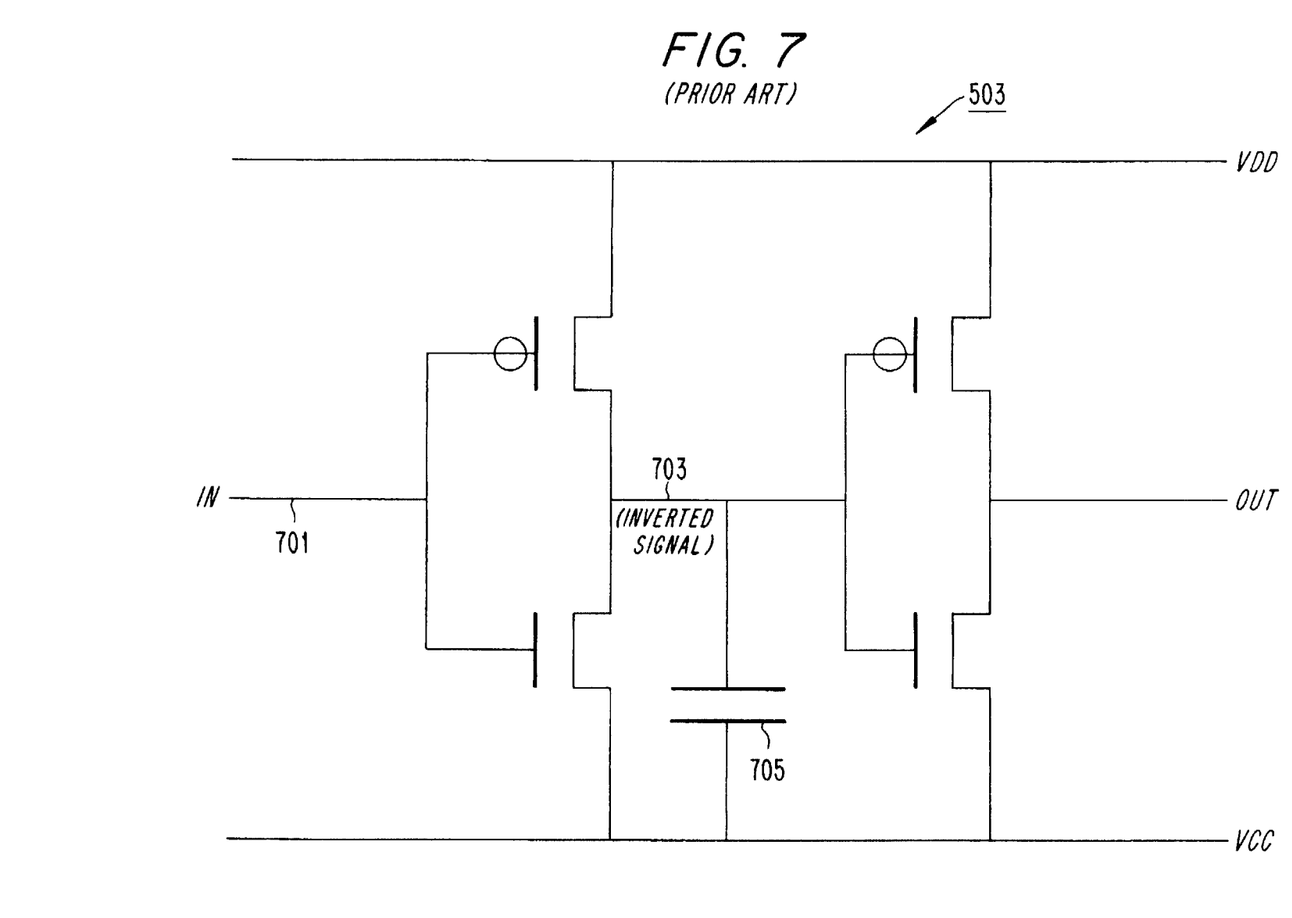
FIG. 7 is a more detailed block diagram of a conventional delay stage.

A conventional delay stage 503 is illustrated in more detail in FIG. 7. The input signal 701 is supplied to a first invertor arrangement that generates the inverted signal 703. The amount of delay is determined by how long it takes the inverted signal 703 to charge the capacitor 705 to a value that makes the second invertor change its output. The amount of the delay is, unfortunately, not constant, but instead varies with temperature, process variations, power supply, and input signal. The normal delay spread, when designed to produce a minimum delay of 3 ns, is a delay that can vary between 3 ns and 6 ns.

Returning now to the problem of designing a high speed switched capacitor sigma-delta modulator, the normal delay spread of a clock generator is +/−40%. Since it was determined above that the minimum permissible cycle time $T_{Cycle}$ is 42 ns, a clock generator having this as the minimum cycle time can be expected to generate clocks that result in a maximum cycle time of $$\left(\frac{42}{(1-.4)}\right)*(1+.4)=98\ ns.$$

Thus, the switched-capacitor sigma-delta modulator using the conventional clock generator could not be relied on to execute at a speed any faster than 1/98 ns=10.2 MHz.

If it is desired to operate the switched capacitor sigma-delta modulator at a higher rate, such as at 13 MHz, then the maximum allowable cycle time, $T_{Cycle}$, is $1/(13*10^6)=77$ ns. This means that, instead of the typical delay spread of 40%, a clock generator must be designed so that its delay spread is no worse than:

$$\left(\frac{42}{(1-\text{delay spread})}\right)*(1+\text{delay spread}) = 77$$

delay spread = 29%

However, it is not presently possible to design a delay stage 503 having this level of accuracy. Therefore, conventional techniques have prevented the operation of switched capacitor sigma-delta modulators at clock rates significantly higher than about 10 MHz.

Figure 8:
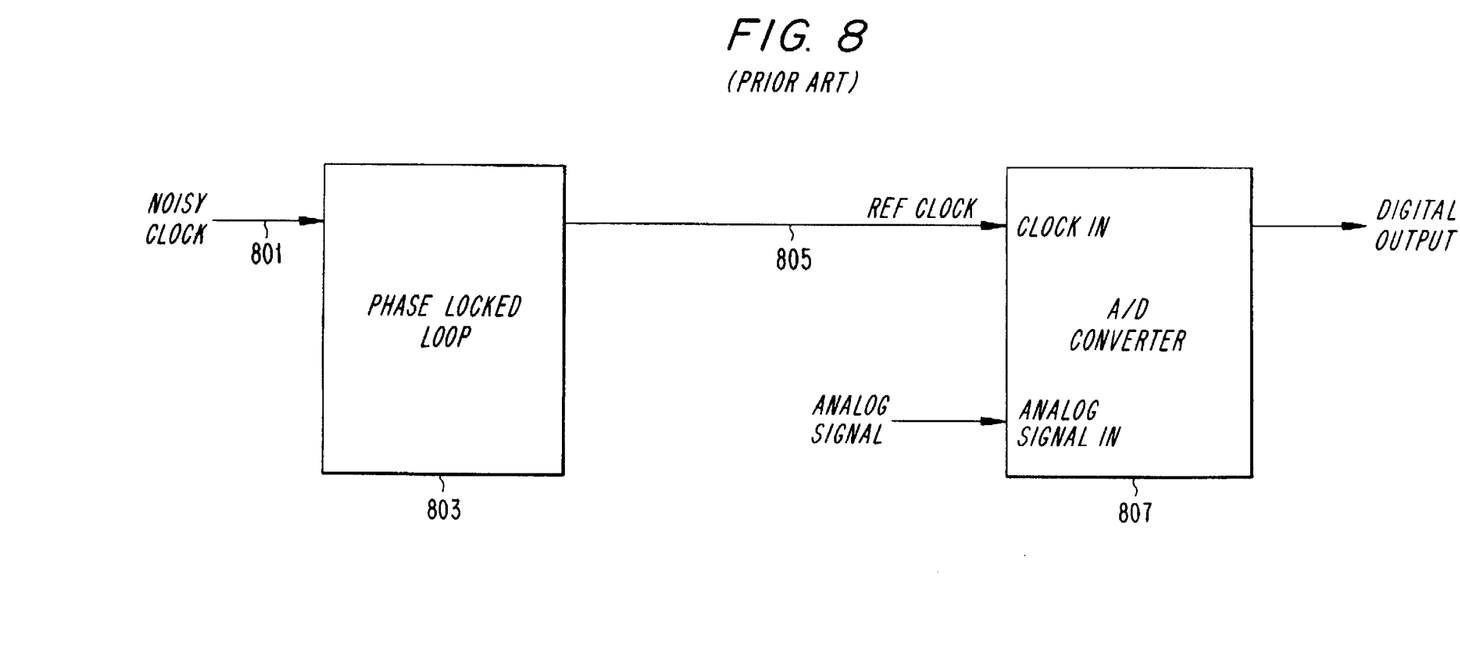
FIG. 8 is a block diagram of a prior art technique for eliminating variable periodic noise from a clock that is to be supplied as the reference clock for an analog-to-digital converter.

The prior art, such as U.S. Pat. No. 5,349,352, issued to Saleh, has addressed the problem of providing a less noisy reference clock 501 to a sigma-delta A/D converter. In order to eliminate variable periodic noise, such as noise centered about 60 Hz from a power line, the prior art describes an arrangement, illustrated FIG. 8, in which a phase locked loop 803 receives a noisy clock signal 801, and generates a cleaner reference clock 805 that is supplied to an A/D converter 807. The A/D converter 807 may then use the reference clock 805 to generate the various phase clocks p1, p1e, p2, p2e in the manner described above with respect to FIGS. 5-7. It is apparent that this technique does not enable one to operate the A/D converter 807 at very high rates because it does nothing to address the problems introduced by the delay stages 503 that are inside the A/D converter. That is, even though the reference clock 805 may be of better quality, the delay stages 503 cannot be relied on to accurately generate delays that are very close to the minimum desired delay of 3 ns.

SUMMARY

It is therefore an object of the present invention to provide a method and apparatus for generating nonoverlapping clock signals that are of sufficient quality to operate sigma-delta modulators at significantly higher rates than have been possible using conventional techniques.

In accordance with one aspect of the present invention, the foregoing and other objects are achieved in an apparatus that comprises input means for receiving a reference clock signal, and controllable delay means, coupled to the input means, for generating from the received reference clock signal a plurality of delayed reference clock signals. For each of the plurality of delayed reference clock signals, a corresponding amount of delay is controllable by a control signal. The apparatus further comprises phase comparator means, coupled to the input means and to the delay means, for generating an error signal whose magnitude is proportional to an amount by which a measured phase relation between the received reference clock signal and a preselected one of the most delayed reference clock signal differs from a predetermined phase relation. In an alternative embodiment, the phase comparator means is only coupled to the controllable delay means, and generates an error signal whose magnitude is proportional to an amount by which measured phase relation between a first preselected one of the plurality of delayed reference clock signals and a second preselected one of the plurality of delayed reference clock signals differs from a predetermined phase relation.

In either embodiment, the error signal is supplied to the controllable delay means for use as the control signal for controlling the amount of delay of each of the plurality of delayed reference clock signals. By feeding back the error signal in this manner, the amount of delay that is generated by the controllable delay means locks in to a stable amount.

The apparatus still further comprises logic means for generating nonoverlapping first and second phase clock signals from the plurality of delayed reference clock signals. In one embodiment of the invention, the first phase clock signal comprises a first early phase clock signal and a first standard phase clock signal, and the second phase clock signal comprises a second early phase clock signal and a second standard phase clock signal. Finally, the apparatus includes switched capacitor sigma-delta modulator means. The switched capacitor sigma-delta modulator means comprises clock input means, coupled to receive the nonoverlapping first and second phase clock signals; signal input means for receiving a signal to be modulated; and means, including switched capacitor circuitry, for modulating the signal to be modulated under control of the nonoverlapping first and second phase clock signals.

By using the nonoverlapping clocks generated in this manner, the switched-capacitor sigma-delta modulator may be operated at rates significantly above 10 MHz, (e.g., 13 MHz or higher).

In accordance with another aspect of the invention, the controllable delay means comprises a plurality of series-connected controllable delay stages, including a first one of the controllable delay stages and one or more subsequent ones of the plurality of series-connected controllable delay stages. Each one of the plurality of series-connected controllable delay stages has an input for receiving the control signal that controls the amount of delay that is generated by said one of the plurality of series-connected controllable delay stages. The first one of the controllable delay stages is coupled to receive the reference clock signal from the input means, and generates a first delayed reference clock signal at an output. Furthermore, the one or more subsequent ones of the plurality of series-connected controllable delay stages receive an output signal from a previous one of the plurality of series-connected controllable delay stages, and generate therefrom a further delayed reference clock signal.

BRIEF DESCRIPTION OF THE DRAWINGS

The objects and advantages of the invention will be understood by reading the following detailed description in conjunction with the drawings in which.

DETAILED DESCRIPTION

The various features of the invention will now be described with respect to the figures, in which like parts are identified with the same reference characters.

Figure 9:
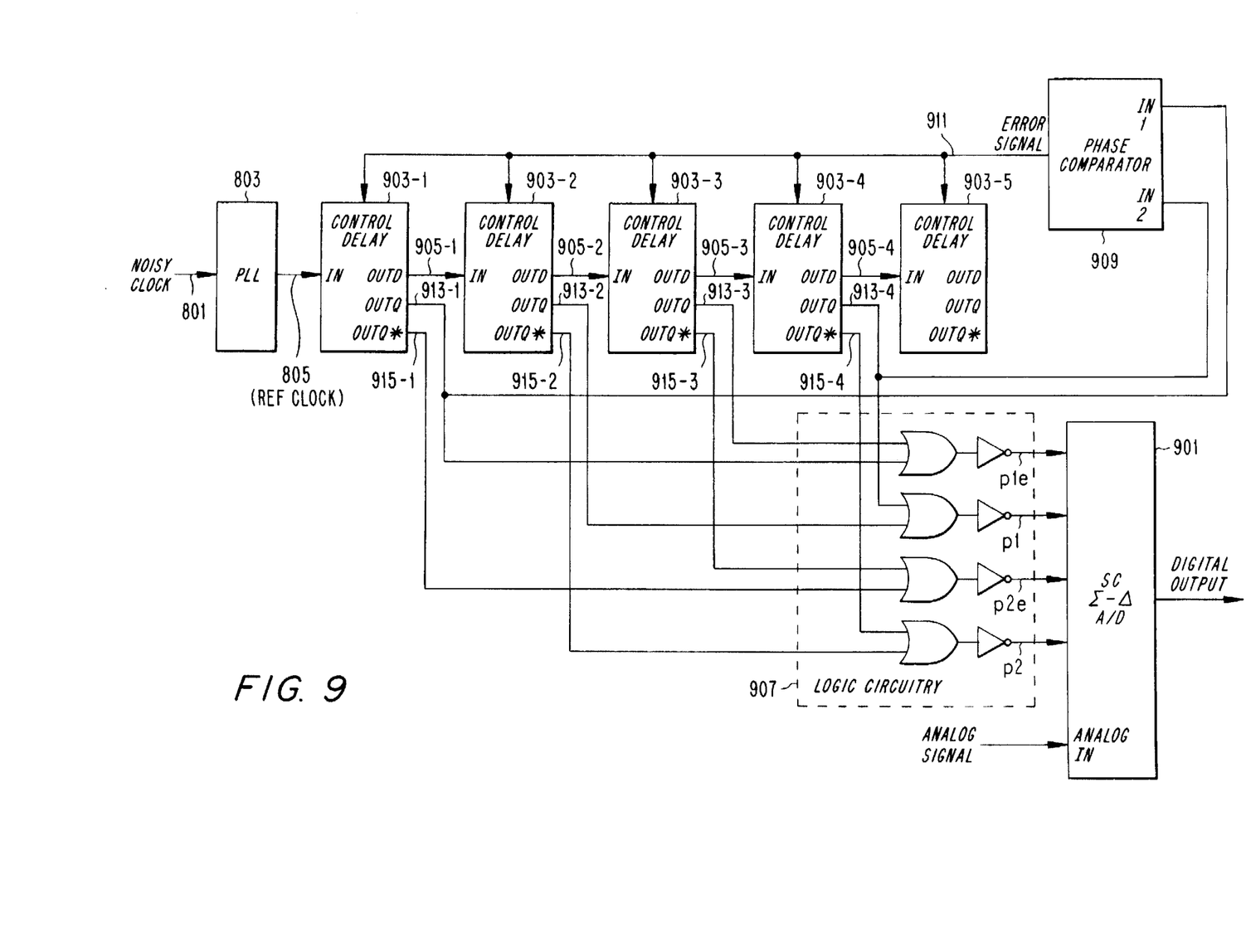
FIG. 9 is a block diagram of a preferred embodiment of an apparatus comprising a clock generator and a sigma-delta modulator in accordance with the present invention.

A preferred embodiment of the invention will now be described with respect to FIG. 9. A switched capacitor sigma-delta A/D converter 901 is constructed using conventional techniques, but is nonetheless capable of operating at speeds of 13 MHz or higher because of the very accurate phase clocks p1, p1e, p2, p2e that are generated in the following manner.

A reference clock 805 is input to the system. The reference clock operates at a rate equal to the desired rate of operation of the switched capacitor sigma-delta A/D convertor 901, such as 13 MHz or higher. In a preferred embodiment of the invention, the quality of the reference clock 805 is improved by applying conventional techniques, such as using a phase locked loop (PLL) 803 to remove variable periodic noise that may be present in the noisy clock 801 that is used as a source. Of course, the use of a phase locked loop 803 is not essential to the invention. Any technique that provides a stable, jitter-free reference clock 805 may be used.

In accordance with the present invention, five controllable delay stages 903-1, . . . , 903-5 are connected in series, so that when the reference clock 805 is supplied to the input of a first controllable delay stage 903-1, a set of increasingly delayed clock signals (OUTD) 905-1, . . . , 905-4 is made available at the sequence of outputs of the first four controllable delay stages 903-1, . . . , 903-4. The purpose of the fifth controllable delay stage 903-5 is to provide a load to the fourth controllable delay stage 903-4 that is equal to the load seen by each of the other three controllable delay stages 903-1, . . . , 903-3. The output of the fifth controllable delay stage 903-5 is not used.

In addition to the OUTD signal 905-x, the preferred embodiment of the invention has each of the controllable delay stages 903-1, . . . , 903-5 also supplying an OUTQ signal 913-x and an OUTQ* signal 915-x. The OUTQ signals 913-x are equal in value to the OUTD signals 905-x. The OUTQ* signals 915-x are complemented versions of the OUTQ signals 913-x. The OUTQ and OUTQ* signals 913-x, 915-x are generated for the purpose of being supplied to the logic circuitry 907. This allows the OUTD signals 905-1 to each be identically loaded, so that the controllable delay stages 903-x will each insert substantially the same amount of delay, which in a preferred embodiment is 5 ns for operation of the switched capacitor sigma-delta A/D convertor 901 at 13 MHz.

The logic circuitry 907 converts the OUTQ and OUTQ* signals 913-1, . . . , 913-4, 915-1, . . . , 915-4 into the very accurate phase clocks p1, p1e, p2, p2e. The logic circuitry 907 is designed in accordance with well-known techniques in order to generate the phase clocks p1, p1e, p2, p2e having the proper duty cycle and delays with respect to one another.

In order to operate the controllable delay stages 903-1, . . . , 903-5 so as to achieve very low delay spread characteristics, a phase comparator 909 is introduced into the design. The phase comparator 909 has two inputs. The first input of the phase comparator 909 receives a first one of the delayed signals OUTQ, such as OUTQ 913-1 that is generated by the first controllable delay stage 903-1. The second input of the phase comparator 909 receives a second one of the delayed signals OUTQ, such as OUTQ 913-4 that is generated by the fourth controllable delay stage 903-4. The selection of which two delayed signals to supply to the phase comparator 909 is a matter of design choice that depends on the particular design of the phase comparator 909. The phase comparator 909 may be easier to design, and also more accurate, if two signals that are farther apart in phase are selected, instead of two signals that are relatively close together (i.e., delayed by a small amount). In an alternative embodiment of the invention, one of the signals that is supplied to the phase comparator 909 is the reference clock 805, instead of one of the OUTQ signals 913-x.

Figure 10:
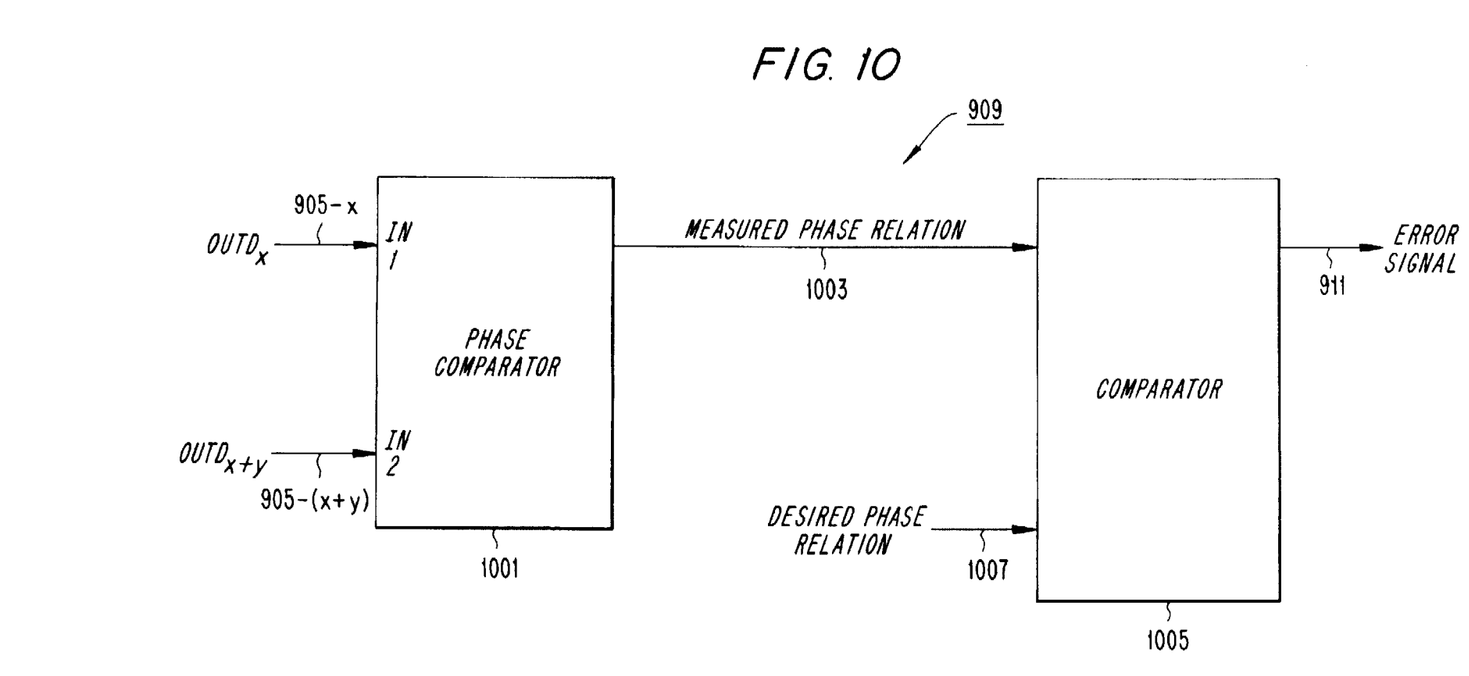
FIG. 10 is a more detailed block diagram of a phase comparator for use in the present invention.

The operation of the phase comparator 909 will now be described with reference to FIG. 10, which is a more detailed block diagram of the phase comparator 909. The phase comparator 909 performs two comparisons: First, two of the delayed clock signals, OUTDX 905-x and OUTD$_{x+y}$ 905-(x+y) are applied to respective first and second inputs of a phase comparator 1001. (As mentioned above, one of the delayed clock signals OUTD 905 may alternatively be the reference clock 805.) The output of the phase comparator 1001 is a measured phase relation signal 1003. The measured phase relation signal 1003 is then applied to a first input of a comparator 1005. A second input of the comparator 1005 receives a reference signal that represents the desired phase relation 1007 between the two delayed clock signals OUTDX 905-x, OUTD$_{x+y}$ 905-(x+y). The desired phase relation is predetermined to represent the total desired delay that is to be produced between the selected two delayed clock signals OUTDX 905-x, OUTD$_{x+y}$ 905-(x+y).

Figure 11:
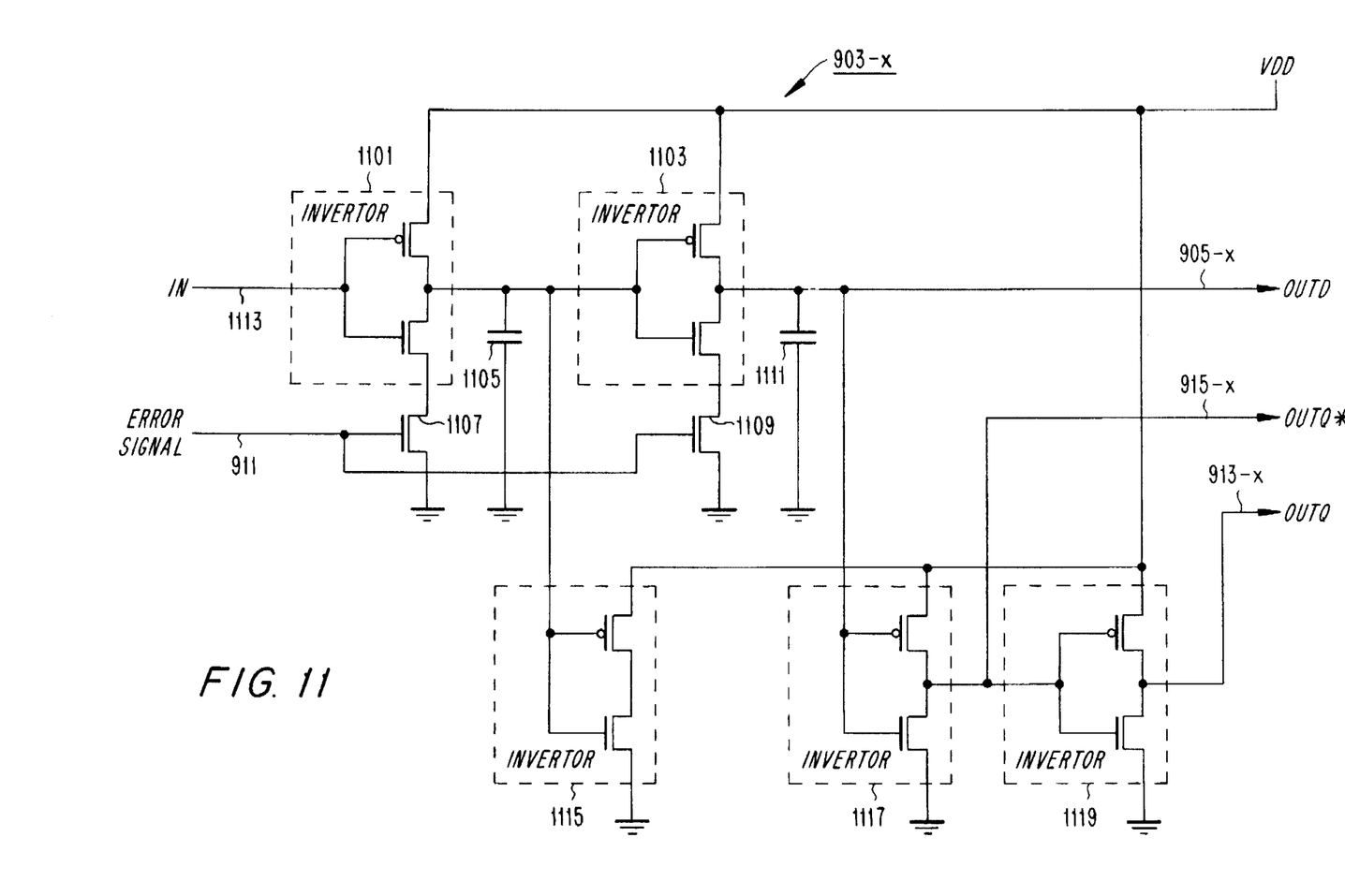
FIG. 11 is a detailed diagram of a controllable delay stage that is used in accordance with one embodiment of the present invention.

Referring back, now, to FIG. 9, the error signal 911 is applied to a control input of each of the five controllable delay stages 903-1, . . . , 903-5. A preferred embodiment of one of the controllable delay stages 903-x (where 1≦x≦5) is shown in FIG. 11. Like the delay stage 503 illustrated in FIG. 5, the controllable delay stage 903-x comprises two invertor circuits 1101, 1103 connected in series, with a first capacitor 1105 arranged between the two invertor circuits 1101, 1103 for controlling the delay in turning on and off of the second invertor circuit 1103. A second capacitor 1111 is connected between the output of the second invertor 1103 and ground in order to control the delay in generating the output signal OUTD 905-x. In the preferred embodiment of the controllable delay stage 903-x, which is implemented as a single integrated circuit, the first and second capacitors 1105, 1111 are introduced into the circuit in the form of gate capacitances of p- and n-transistors that are connected in series between the supply voltage VDD and ground. The use of gate capacitance in this manner is well-known in the art, and is not described here in further detail. 10 The controllable delay stage 903-x differs from the delay stage 503 in that it has, in addition, two n-transistors 1107, 1109, each connected between a respective one of the two invertor circuits 1101, 1103 and ground. The gate of each of the n-transistors 1107, 1109 is connected to receive the error signal 911 that is generated by the phase comparator 909. By asserting the error signal 911, one can control the discharge time of each of the two capacitors 1105, 1111, thereby dynamically controlling the amount of delay that is introduced between the input line 1113 and the output signal OUTD 905-x.

In an alternative embodiment, the two n-transistors 1107, 1109 may be replaced with p-transistors (not shown) connected between each of the invertors 1101, 1103 and the supply voltage VDD. In this alternative configuration, it is the charging time of each of the two capacitors 1105, 1111 that is controlled instead of the discharge time. Of course, one may also design a delay stage having both n- and p-transistors for controlling both the charging and discharging time of the two capacitors 1105, 1111. In this latter case, however, two input control voltages would have to be applied (one for each of the n- and p-transistors), which makes the design of the phase comparator 909 more complicated.

In addition to the elements described above, the exemplary delay stage 903-x has, in addition, third, fourth and fifth invertor circuits 1115, 1117, 1119. The fourth invertor circuit 1117 is coupled to the output of the second invertor circuit 1103, so that it may generate the inverted signal OUTQ* 915-x. The output of the fourth invertor circuit 1117 is also coupled to the input of the fifth invertor circuit 1119, which generates a non-inverted signal OUTQ 913-x which may be supplied to the logic circuitry 907. The reason for supplying the non-inverted signal OUTQ 913-x instead of the delayed output signal OUTD 905-x to the logic circuitry 907, is to ensure that the second invertor circuit 1103 in each of the first four controllable delay stages 903-1, . . . , 903-4 sees the same capacitive load, namely the input of a next controllable delay stage 903-x, thereby minimizing timing differences between the four controllable delay stages 903-1, . . . , 903-4. The fifth controllable delay stage 903-5, whose outputs are not used, is provided solely to provide a uniform load to the second invertor circuit 1103 of the fourth controllable delay stage 903-4, as will be explained in further detail below.

To ensure that the first invertor circuits 1101 of each of the controllable delay stages 903-1, . . . , 903-4 also see the same capacitive load as is seen by the output of the second invertor circuit 1103, a third invertor circuit 1115 is provided within each of the controllable delay stages 903-x. Within a first given controllable delay stage 903-x, the third invertor circuit 1115 is to the first invertor circuit 1101, what the first invertor circuit 1101 of a next controllable delay stage 903-(x+1) is to the second invertor circuit 1103 of the first given controllable delay stage 903-x.

The invention is not limited to the use of the controllable delay stage 903-x illustrated in FIG. 11. Rather, those having ordinary skill in the art will recognize that other types of controlled delay-stages may be used as well.

Returning, now, to FIG. 9, it can be seen that the phase comparator 909 in combination with the controllable delay stages 903-1, . . . , 903-4 form a phase locked loop that will settle when the desired phase relation is achieved. Because, in the preferred embodiment, the circuit is manufactured as a single integrated circuit, the manufacturing process ensures that the amount of delay introduced by each of the controllable delay stages 903-1, . . . , 903-5 is substantially uniform, differing from one stage to another by only a few percentage points. Therefore, controlling the amount of delay based on a measurement of the two delayed clock signals OUTD, 905-x, OUTD$_{x+y}$, 905-(x+y) substantially assures that each one of the controllable delay stages 903-1, . . . , 903-5 produces the desired amount of delay.

Accordingly, the four delayed clocks 905-1, . . . , 905-4 have much tighter tolerances than are produced by the ordinary delay stages 503 that are used in the prior art for generating clock signals for sigma-delta modulators.

Because of the better tolerances, the delayed clocks 905-1, . . . , 905-4 may be run at higher speeds (e.g., 13 MHz and higher) and still be applied to the logic circuitry 907 for generating the phase clocks p1, p1e, p2, p2e without the risk of having any of the times $T_1$, $T_2$, $T_3$, $T_4$, $T_5$ and $T_6$ (see FIG. 4) be below the minimum acceptable duration. In designing the logic circuitry 907, one must take care to ensure that it does not introduce variable delays that would affect the tolerances of the phase clocks p1, p1e, p2, p2e. For example, in a design for implementation on a CMOS integrated circuit, one must ensure that all of the output nodes of the logic circuitry 907 have equal parasitic capacitances, in order to have uniform delays introduced for each of the phase clocks p1, p1e, p2, p2e. This problem has been handled, in the exemplary embodiment, by generating the separate signals OUTQ 913-x and OUTQ* 915-x that are supplied to the logic circuitry 907 instead of the OUTD signals 905-x, which are used only for the purpose of generating proper timing. Also, as explained above with respect to FIG. 11, a preferred embodiment of one of the controllable delay stages 903-x ensures that parasitic capacitances are uniform from stage to stage.

The invention has been described with reference to a particular embodiment. However, it will be readily apparent to those skilled in the art that it is possible to embody the invention in specific forms other than those of the preferred embodiment described above. This may be done without departing from the spirit of the invention. For example, the exemplary embodiment utilizes five controllable delay stages 903-1, . . . , 903-5, the first four of which are actually used for generating the very accurate phase clocks p1, p1e, p2, p2e. However, the actual number of delay stages, as well as the selection of which ones are to be monitored by the phase comparator 909, is a matter of design choice.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. An apparatus, comprising:

input means for receiving a reference clock signal;

controllable delay means, coupled to the input means, for generating from the received reference clock signal a plurality of delayed reference clock signals, wherein for each of the plurality of delayed reference clock signals, a corresponding amount of delay is controllable by a control signal;

phase comparator means, coupled to the input means and to the controllable delay means, for generating an error signal whose magnitude is proportional to an amount by which a measured phase relation between the received reference clock signal and a preselected one of the plurality of delayed reference clock signals differs from a predetermined phase relation, wherein the error signal is supplied to the controllable delay means for use as the control signal for controlling the amount of delay of each of the plurality of delayed reference clock signals;

logic means for generating nonoverlapping first and second phase clock signals from the plurality of delayed reference clock signals; and switched capacitor sigma-delta modulator means, comprising:

clock input means, coupled to receive the nonoverlapping first and second phase clock signals;

signal input means for receiving a signal to be modulated; and means, including switched capacitor circuitry, for modulating the signal to be modulated under control of the nonoverlapping first and second phase clock signals.

2. The apparatus of claim 1, wherein:

the first phase clock signal comprises a first early phase clock signal and a first standard phase clock signal; and the second phase clock signal comprises a second early phase clock signal and a second standard phase clock signal.

3. The apparatus of claim 1, wherein the controllable delay means comprises a plurality of series-connected controllable delay stages, including a first one of the controllable delay stages and one or more subsequent ones of the plurality of series-connected controllable delay stages, wherein:

each one of the plurality of series-connected controllable delay stages has an input for receiving the control signal that controls the amount of delay that is generated by said one of the plurality of series-connected controllable delay stages;

the first one of the controllable delay stages is coupled to receive the reference clock signal from the input means, and generates a first delayed reference clock signal at an output; and the one or more subsequent ones of the plurality of series-connected controllable delay stages receive an output signal from a previous one of the plurality of series-connected controllable delay stages, and generate therefrom a further delayed reference clock signal.

4. An apparatus, comprising:

input means for receiving a reference clock signal;

controllable delay means, coupled to the input means, for generating from the received reference clock signal a plurality of delayed reference clock signals, wherein for each of the plurality of delayed reference clock signals, a corresponding amount of delay is controllable by a control signal;

phase comparator means, coupled to the controllable delay means, for generating an error signal whose magnitude is proportional to an amount by which a measured phase relation between a first preselected one of the plurality of delayed reference clock signals and a second preselected one of the plurality of delayed reference clock signals differs from a predetermined phase relation, wherein the error signal is supplied to the controllable delay means for use as the control signal for controlling the amount of delay of each of the plurality of delayed reference clock signals;

logic means for generating nonoverlapping first and second phase clock signals from the plurality of delayed reference clock signals; and switched capacitor sigma-delta modulator means, comprising:

clock input means, coupled to receive the nonoverlapping first and second phase clock signals;

signal input means for receiving a signal to be modulated; and means, including switched capacitor circuitry, for modulating the signal to be modulated under control of the nonoverlapping first and second phase clock signals.

5. The apparatus of claim 4, wherein:

the first phase clock signal comprises a first early phase clock signal and a first standard phase clock signal; and the second phase clock signal comprises a second early phase clock signal and a second standard phase clock signal.

6. The apparatus of claim 4, wherein the controllable delay means comprises a plurality of series-connected controllable delay stages, including a first one of the controllable delay stages and one or more subsequent ones of the plurality of series-connected controllable delay stages, wherein:

each one of the plurality of series-connected controllable delay stages has an input for receiving the control signal that controls the amount of delay that is generated by said one of the plurality of series-connected controllable delay stages;

the first one of the controllable delay stages is coupled to receive the reference clock signal from the input means, and generates a first delayed reference clock signal at an output; and the one or more subsequent ones of the plurality of series-connected controllable delay stages receive an output signal from a previous one of the plurality of series-connected controllable delay stages, and generate therefrom a further delayed reference clock signal.

7. A method of modulating a signal, comprising the steps of:

receiving a reference clock signal;

using controllable delay means to generate a plurality of delayed reference clock signals from the received reference clock signal;

measuring a phase relation between the received reference clock signal and a preselected one of the plurality of delayed reference clock signals;

comparing the measured phase relation to a predetermined phase relation, and generating an error signal from the comparison;

using the error signal to control an amount of delay that is introduced by the controllable delay means and then generating a next plurality of delayed reference clock signals;

generating nonoverlapping first and second phase clock signals from the next plurality of delayed reference clock signals;

applying a signal to be modulated to a signal input means of a switched capacitor sigma-delta modulator means; and using the switched capacitor sigma-delta modulator to modulate the signal to be modulated under control of the nonoverlapping first and second phase clock signals.

8. A method of modulating a signal, comprising the steps of:

receiving a reference clock signal;

using controllable delay means to generate a plurality of delayed reference clock signals from the received reference clock signal;

measuring a phase relation between a first preselected one of the plurality of delayed reference clock signals and a second preselected one of the plurality of delayed reference clock signals;

comparing the measured phase relation to a predetermined phase relation, and generating an error signal from the comparison;

using the error signal to control an amount of delay that is introduced by the controllable delay means and then generating a next plurality of delayed reference clock signals;

generating nonoverlapping first and second phase clock signals from the next plurality of delayed reference clock signals;

applying a signal to be modulated to a signal input means of a switched capacitor sigma-delta modulator means; and using the switched capacitor sigma-delta modulator to modulate the signal to be modulated under control of the nonoverlapping first and second phase clock signals.

* * * * *